United States Patent [19]

Bayraktaroglu

[11] Patent Number: 4,568,889

[45] Date of Patent: Feb. 4, 1986

[54] DISTRIBUTED DIODE VCO WITH STRIPLINE COUPLED OUTPUT AND DISTRIBUTED VARIABLE CAPACITOR CONTROL

[75] Inventor: Burhan Bayraktaroglu, Plano, Tex.

[73] Assignee: Texas Instruments Incorporated, Dallas, Tex.

[21] Appl. No.: 528,208

[22] Filed: Aug. 31, 1983

[51] Int. Cl.$^4$ ............ H03B 7/00; H03B 7/14; H01L 29/90; H01L 29/68

[52] U.S. Cl. ............ 331/46; 331/48; 331/56; 331/96; 331/107 R; 331/107 P; 331/177 V; 357/13; 357/23.14; 333/238; 333/247

[58] Field of Search ............ 331/46, 48, 56, 96, 331/104, 107 R, 107 SL, 107 DP, 107 P, 117 D, 177 R, 177 V; 357/13, 23; 333/222, 238, 247

[56] References Cited

U.S. PATENT DOCUMENTS 3,675,161 7/1972 Teramoto et al. ......... 331/107 R X
4,150,345 4/1979 Goldman et al. ............ 333/247 X

FOREIGN PATENT DOCUMENTS 0068946 1/1983 European Pat. Off. ............ 357/13
1493602 11/1977 United Kingdom ............ 357/13

OTHER PUBLICATIONS

Swan, C. B. "Composite Avalanche Diode Structures for Increased Power Capability" *IEEE Transactions on Electron Devices*, vol. ED-14, No. 9, Sep. 1967, pp. 584–589.

Lineback, R. J. "New IMPATT Structure Widens Radar Vistas by Adding Power" *Electronics*, Dec. 15, 1983, pp. 47-48.

Curtice, W. R. et al., "Varactor-Tuneable Pulsed Avalanche-Diode Oscillator for X-Band Operation" *Electronics Letters*, vol. 12, No. 6, pp. 131-133, Mar. 18, '76.

*Primary Examiner*—Eugene R. LaRoche
*Assistant Examiner*—D. C. Mis
*Attorney, Agent, or Firm*—Carlton H. Hoel; Robert O. Groover; James T. Comfort

[57] ABSTRACT

In a distributed IMPATT structure, power is coupled out through a side contact. That is, in previously proposed distributed IMPATT structures, the gain medium (the active region of the IMPATT) operates as a transmission line. The prior art has attempted to couple output power from the gain medium through an end contact, i.e., through a contact which is perpendicular to the primary direction of energy propagation (and also to the direction of maximum elongation) of the active medium. In the present invention, a sidewall contact extends in a direction which is parallel to the principal direction of propagation of the energy in the active medium. Thus, the sidewall contact plus the active region together can be considered as a single transmission line. This extended transmission line is also connected to a second distributed semiconductor element which functions as a varactor. By changing the bias voltage on this varactor, the distributed capacitance of a transmission line is changed, and this change in transmission line loading causes a change in the propagation characteristic of the transmission line.

6 Claims, 26 Drawing Figures

TRAVELLING WAVE IMPATT DIODE

CONTACT METAL
n+
(n, p)
p+
CONTACT METAL

MONOLITHIC DISTRIBUTED IMPATT DIODE OSCILLATOR

DIMPATT DIODE OPERATING AS (a) FREE-RUNNING OSCILLATOR, (b) INJECTION-LOCKED AMPLIFIER

MONOLITHIC DISTRIBUTED IMPATT DIODE OSCILLATOR

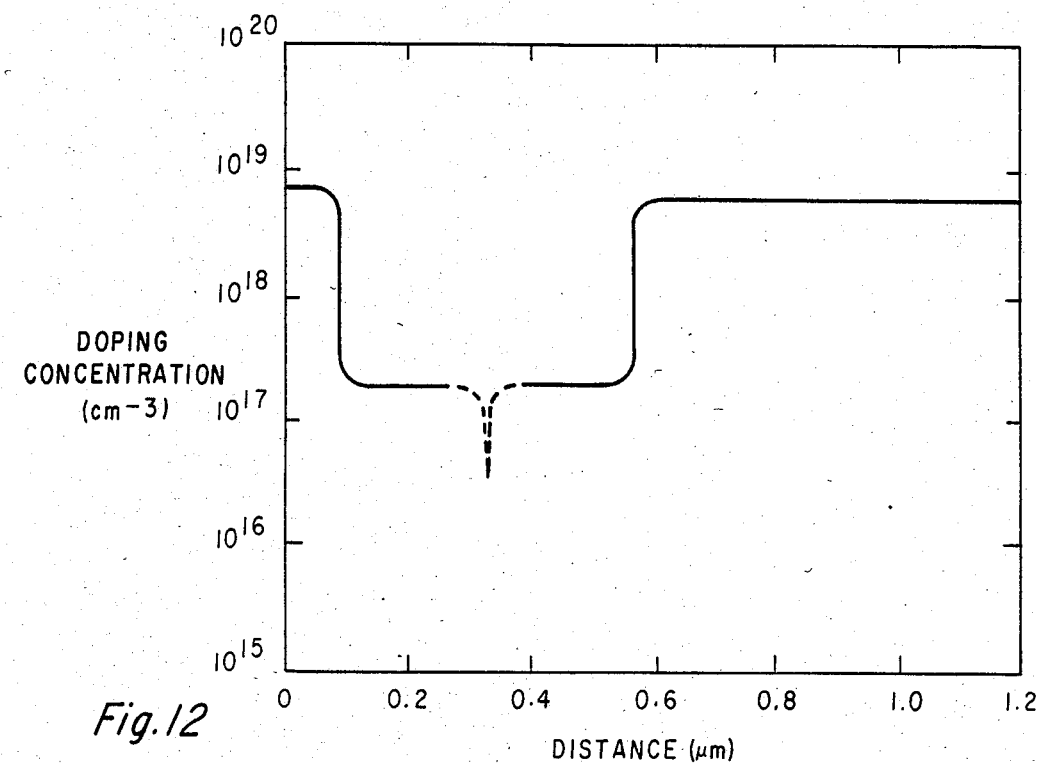
Fig. 12
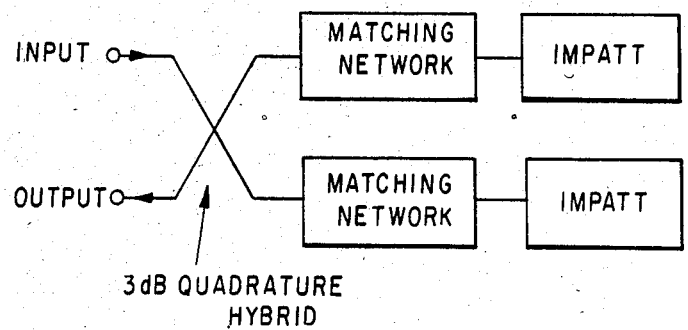
(a)
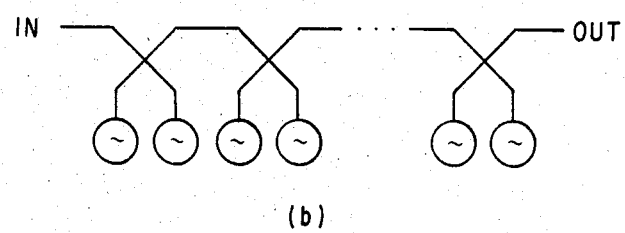
(b)
REALIZING AN INJECTION LOCKED IMPATT AMPLIFIER
USING NO CIRCULATORS (a) SINGLE STAGE (b) CASCADE
Fig. 13

$Z_0 > Z_1 > Z_2 > Z_3$ $z_0 > z_3 > z_2 > z_1$

DISTRIBUTED DIODE VCO WITH STRIPLINE COUPLED OUTPUT AND DISTRIBUTED VARIABLE CAPACITOR CONTROL

BACKGROUND AND SUMMARY OF THE INVENTION

The present invention relates to microwave and millimeter-wave solid state devices. In particular, the present invention relates to monolithic microwave integrated circuits. In particular, the present invention relates to a voltage-controlled oscillator (VCO) for operation at millimeter-wave frequencies (above 30 GHz).

Numerous methods have been used in the microwave art to configure voltage-controlled oscillators (VCO). VCOs are essential to many microwave applications, such as chirped radar and electronic counter measures, in addition to the general utility of VCOs as circuit elements. However, an important limitation of many prior-art microwave VCOs is frequency range and frequency agility. That is, conventional microwave means such as YIG-tuned oscillators, have important frequency limitations.

Thus it is an object of the present invention to provide a solid-state voltage-controlled oscillator which can operate at 94 GHz.

A further difficulty with the prior art voltage-controlled oscillator circuits is their parasitic reactance. That is, where an active element must be connected to a resonating circuit containing a variable-reactance element, the connections themselves become sources of trouble at millimeter-wave frequencies. That is, it is very difficult to design any connection scheme which will not introduce major and uncertain amounts of reactance, and which will not provide substantial resistive and radiation losses.

Thus it is an object of the present invention to provide a voltage-controlled oscillator wherein the active element is completely integrated with a variable-reactance element.

It is a further object of the present invention to provide a voltage-controlled oscillator wherein the active element is completely integrated with the variable-reactance element, and which is capable of operation at frequencies well in excess of 30 GHz.

A further important desideratum in microwave VCOs is frequency agility. That is, the techniques which are required for high-frequency voltage-controlled oscillation are not always compatible with extreme frequency agility. However, frequency agility is itself necessary for many electronic counter measure applications, and is highly desirable for many chirped radar applications.

Thus it is an object of the present invention to provide a voltage-controlled oscillator which can oscillate and provide frequency agility in excess of 1 GHz per micro second at frequencies in excess of 30 GHz.

An integrated low-loss millimeter-wave phase shifter is also useful for many applications, particularly phased array radar.

Thus it is an object of the present invention to provide an integrated low-loss millimeter-wave phase shifter.

BRIEF DESCRIPTION OF THE DRAWINGS

The present invention will be described with reference to the accompanying drawings, wherein:

FIG. 12 shows the doping profile corresponding to the structure of FIG. 11;

FIG. 13 shows how multiple IMPATTs according to the present invention can be combined in an injection-locked amplifier;

DESCRIPTION OF THE PREFERRED EMBODIMENTS

The structure and operation of a distributed 2-port oscillator, which is itself novel, will first be described in detail, and then the distributed VCO of the present invention will be described.

The present invention is not by any means limited to distributed IMPATT diodes, but is in general applicable to a distributed realization of any 2-terminal device with gain. That is, applicable device types which may be realized in a distributed mode include not only IMPATTs and other Avalanche Transit-Time Devices (such as BARITTs, TUNNETTs, MITTATs, DOVATTs, heterojunction IMPATTs, etc.), but also transferredelectron devices (Gunn diodes, oscillators, etc.) and tunnel diodes. However, the presently preferred embodiment uses an IMPATT diode, and this embodiment will be discussed primarily. It should be noted that IMPATT diodes have a particular advantage of good high-frequency characteristics and are preferable to many of the other 2-terminal device types for this reason. However, the scope of the present invention is not limited except as specified in the claims.

A distributed IMPATT is basically a long strip of IMPATT diode. The depletion layer becomes a parallel plate wave guide which supports a travelling-wave. Due to the distributed nature of the device, the power-frequency limitations associated with lumped diodes do not apply. The devices can therefore be made much larger in area than the conventional IMPATTs giving high power handling capability.

Figure 1:
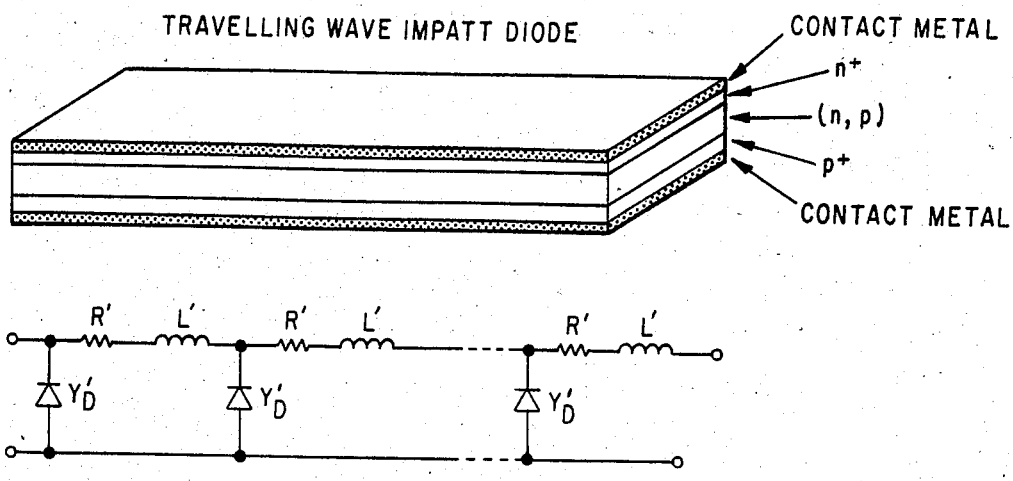
FIG. 1 shows a distributed IMPATT configuration generally, together with its circuit diagram.

A typical structure is shown in FIG. 1. The IMPATT structure is of single-drift type with the drift region made of n-type GaAs. The depletion region terminals (p+ and n+ layers) form the boundary for the waveguide. The device is shunt resonated at the depletion layer boundries, taking full advantage of the high negative conductance of the active layer.

Figure 15:
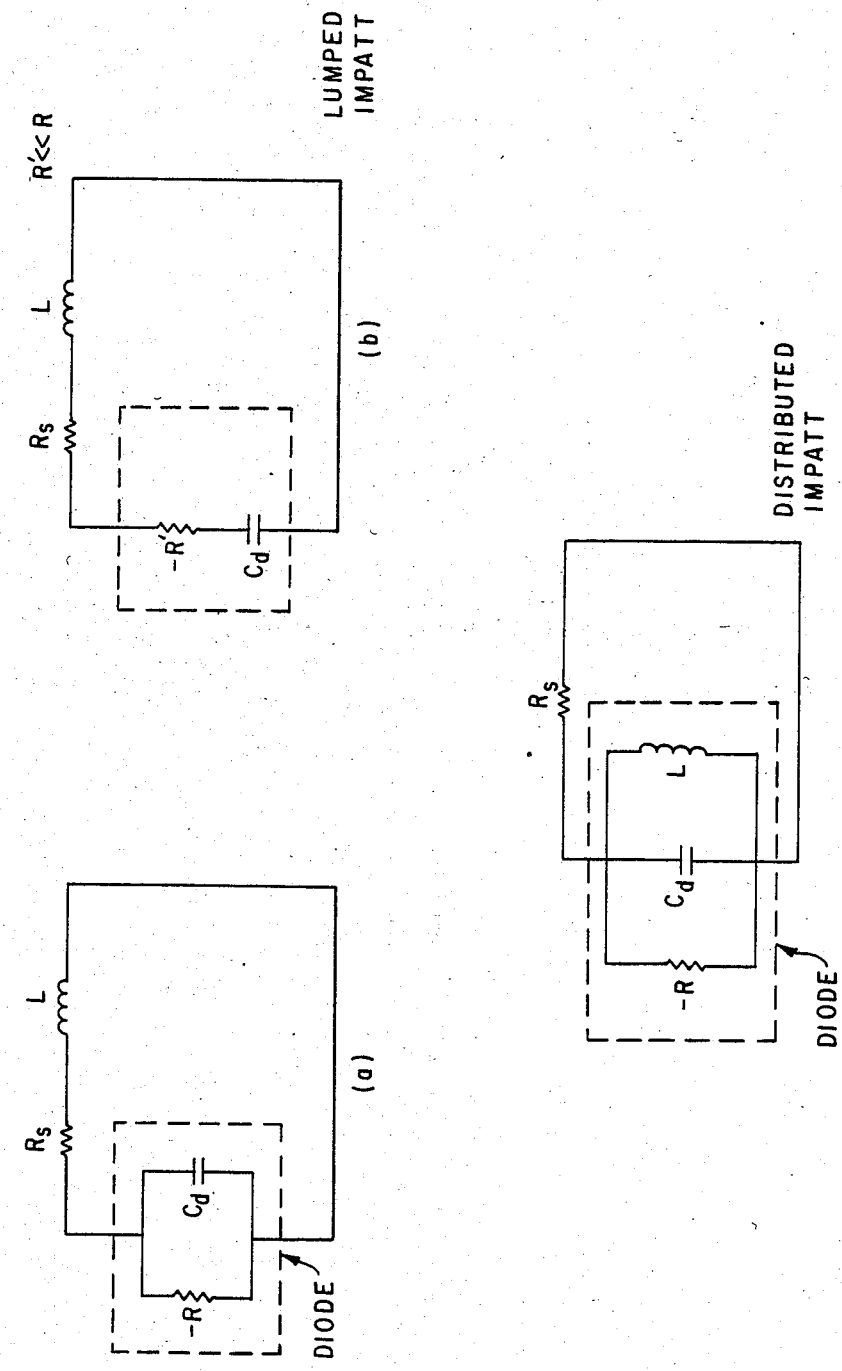
FIG. 15 compares equivalent circuits of distributed IMPATTs and lumped IMPATTs.

This is illustrated in more detail in FIG. 15. In FIG. 15(a), the parallel connected −R and Cd represent the IMPATT. R is usually −500 or larger. In order to oscillate this device, a load with positive real part and inductive imaginary part is needed. This is supplied by waveguide cavities. However, looking from the circuit side, the IMPATT is a series combination of negative resistance R' and Cd (FIG. 15(b)) where R' is about −5. Obviously, Rs which includes all the losses in the circuit and the diode as well as the load resistance, must be smaller than R'. In order to increase R' the diode area is made very small and this in turn limits the power output.

In a distributed device, the waveguide is the depletion layer of the IMPATT and therefore it is shunt resonated as shown in FIG. 15(c). Cd and L components will be made to have equal magnitudes and Rs will now be limited by negative resistance R which is much larger than R'. Therefore, devices do not have to be small and no external resonant circuit is needed.

The key advantages of a travelling-wave IMPATT are at least two;

(1) High power capability due to increased device area for a given frequency.

(2) Built-in resonator capability. No external circuitry is, therefore, needed. In the millimeter-wave range this is an important consideration, since the resonant circuits become more difficult to design and produce than the IMPATT device itself.

Distributed IMPATTs can best be produced in a monolithic form for ease in manufacturing and integration. In the millimeter-wave range, the length and the width of the device are typically 1-5 mm and 10-100 microns respectively. This represents no particular problem in production. A tapered impedance transformer can be produced on SI GaAs to match the load and the device impedances. It is possible to use microstrip lines on 4 mil thick SI GaAs substrate up to at least 100 GHz, and even higher on thinner substrates.

Figure 10:
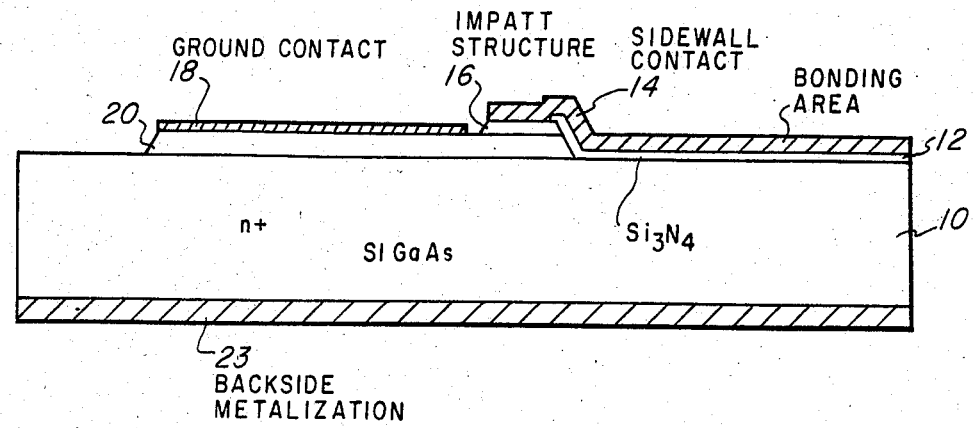
FIG. 10 shows a section through the IMPATT of the present invention, perpendicular to the direction of propagation of the transmission lines.

FIG. 10 shows a sectional view of a monolithic distributed device according to the present invention. A substrate 10 is provided, such as semi-insulating GaAs. Semi-insulating GaAs is preferred because it provides for convenient integration of a distributed device of the present invention with other monolithic microwave integrated circuit components such as FAT, reactors, etc. However, other substrates may be preferred for heat sinking. That is, alternative embodiments of the present invention could also be formed as miniature hybrid structures on diamond, copper, BeO, silver, or thick gold-plated substrate. In these cases the fabrication is quite different, preferably using an AlGaAs etch stop to permit patterning of the contact layers. The importance of heat-sinking depends partly on the operation mode: that is, a pulse-mode operation at a low duty cycle imposes less stringent requirements on heat-sinking than high-duty-cycle or cw applications.

Figure 11:
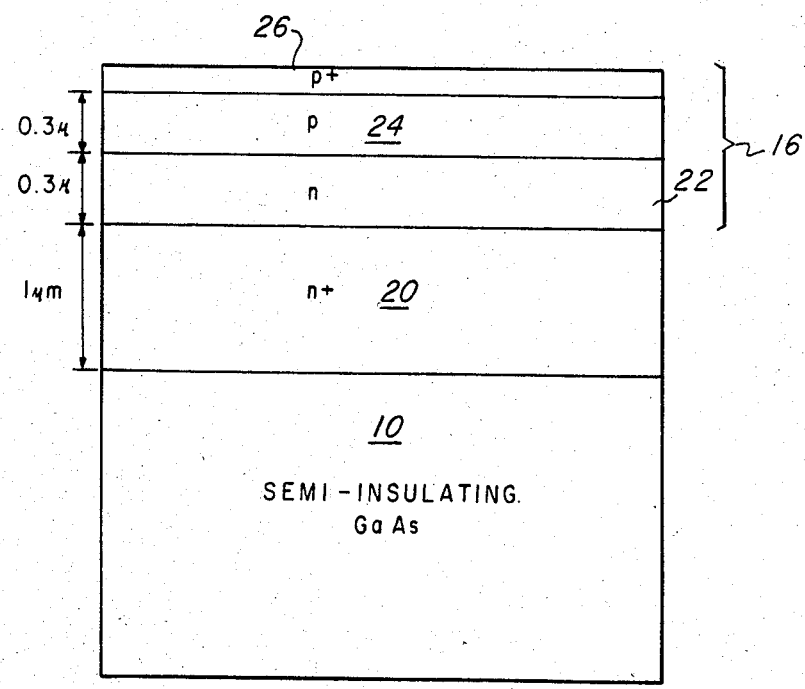
FIG. 11 shows the device structure used, in the presently preferred embodiment, for the active region of a double-drift monolithic distributed IMPATT.
Figure 14:
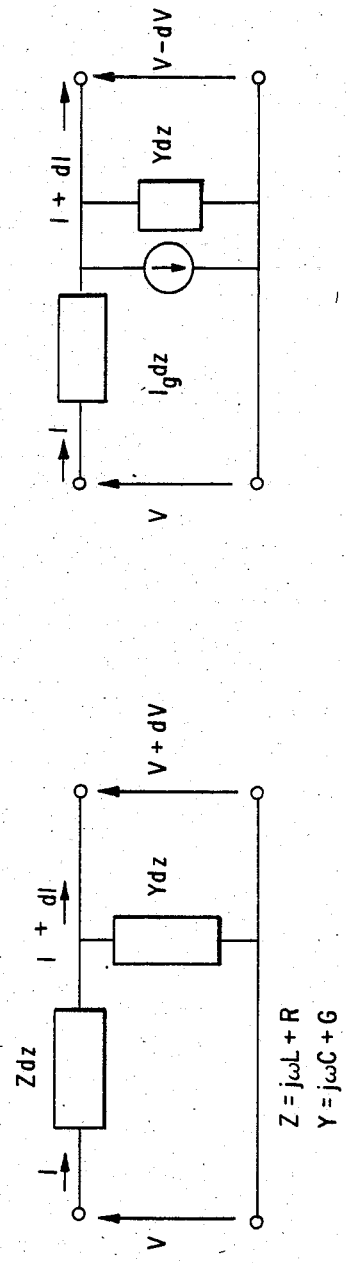
FIG. 14 shows the equivalent circuit of a distributed IMPATT diode.

Atop the semi-insulating (e.g. chrome-doped) GaAs substrate 10 are formed an n+ layer 20 and an active device region 16. In the presently preferred embodiment, these layers are deposited by molecular beam epitaxy. However, other methods well known to those skilled in the art may be used to form the structure. The semiconductor layers in the active region of the device of the present invention are not themselves novel, and a wide variety of prior-art semiconductor structures may be used. The presently preferred embodiment uses a conventional double-drift IMPATT structure as shown in FIG. 11, wherein the backside n+ contact layer 20 which is heavily doped is overlaid by an n-type drift region 22, a p-type drift region 24, and a p+ contact region 26. In the presently preferred embodiment, for operation in the neighborhood of 50 GHz, the drift regions 22 and 24 are each about 300 nano-meters thick. This thickness will be preferably scaled according to frequency, as is well known to those skilled in the art. For example, for operation at 94 GHz, the layers 22 and 24 would each be approximately 200 nanometers thick, and of higher doping density. In the presently preferred embodiment, the doping density of the layers 22 and 24 is each approximately $2 \times 10^{17}$ per cc, but, as well known to those skilled in the art, different doping levels can be chosen. The doping and thickness of these layers are preferably chosen so that the depletion layer surrounding the junction between layers 22 and 24 spreads just to the edge of the contact layers 20 and 26 at the breakdown voltage (which is lower than the operating voltage).

In the presently preferred embodiment the p+ layer 26 is reasonably thin, e.g. 200 nm, but this thickness could be varied. It is essential that the p+ contact layer 26 be thinner than the skin depth at frequencies of interest, but this is not an important constraint, since, for GaAs, the skin depth at 94 GHz is several microns.

The n+ contact layer 20 is preferably thick, but this is done for convenience in the device fabrication steps used. As seen in FIG. 10, a double mesa structure is preferably used. That is, after all layers through layer 26 (FIG. 11) are deposited, the first mesa etch step is performed to define a large mesa. The large mesa corresponds to the width shown for contact layer 20 in FIG. 10. A second mesa etch is then performed to remove the active region 16 (i.e. layers 22, 24, and 26) from the portion of n+ contact layer 20 where the ground contact metallization 18 is typically deposited. Subsequently, a silicon nitride layer 12 is deposited and patterned, and a side contact 14 and ground contact 18 are patterned to provide front and back contacts to the four-layer structure shown in FIG. 11 wherein FIG. 12 shows the doping profile therefor. The back-side metallization 23 is provided merely as an Rf ground plane, and to assist heat-sinking and mounting.

Figure 3:
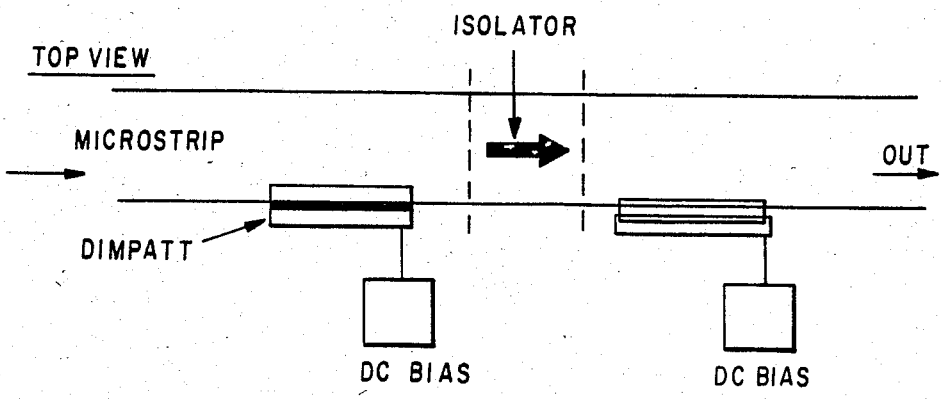
FIG. 3 shows an embodiment wherein a distributed IMPATT according to the present invention is combined with other millimeter wave circuit elements through a microstrip transmission line.
Figure 2:
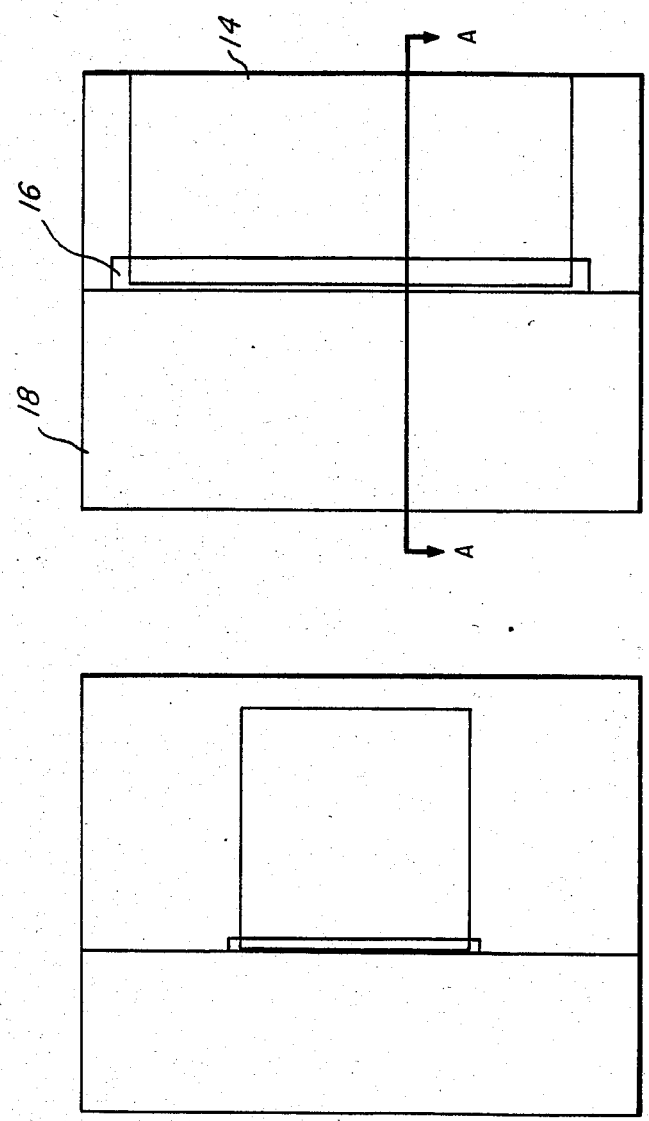
FIG. 2 shows the distributed IMPATT configuration of the present invention, wherein a extended side coupler is used.

A plan view of the distributed device according to the present invention is shown in FIG. 2. The view shown in FIG. 10 corresponds to a sectional view along section A—A. A side coupler 14 operates as a transmission line, propagating energy in the direction shown by the arrow. Thus, the side coupler 14 can itself be converted to a microstrip line, and provide coupling to other circuit elements. One example of a monolithic microwave circuit incorpoating the distributed diode of the present invention is shown in FIG. 3.

As shown in FIG. 2, the diode active region 16 is highly elongated. For example, in the presently preferred embodiment this diode is 10 microns wide, but may be millimeters in length.

Figure 6:
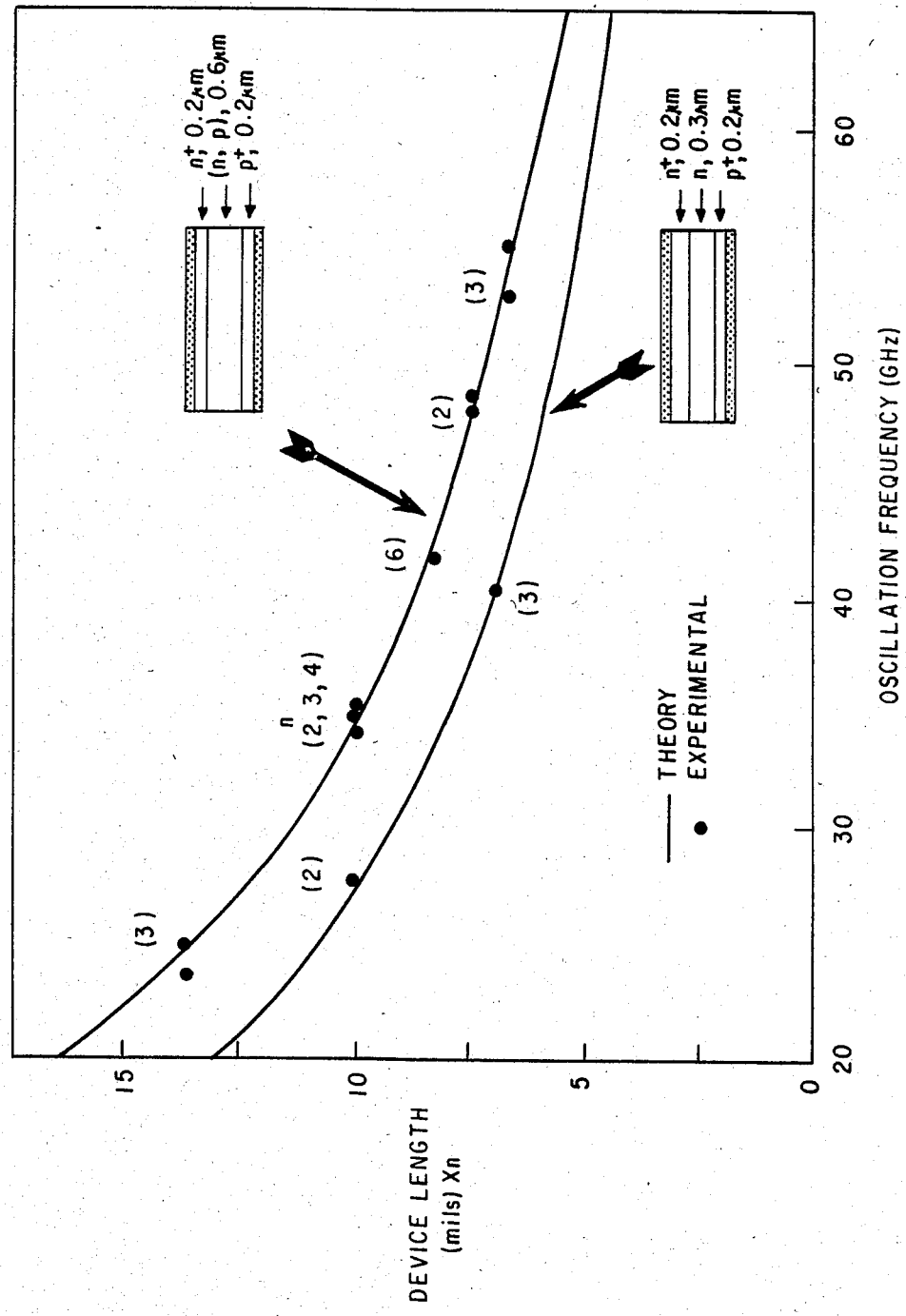
FIG. 6 shows the relation between device length and fundamental-mode oscillation frequency, for several devices constructed according to the present invention.
Figure 7:
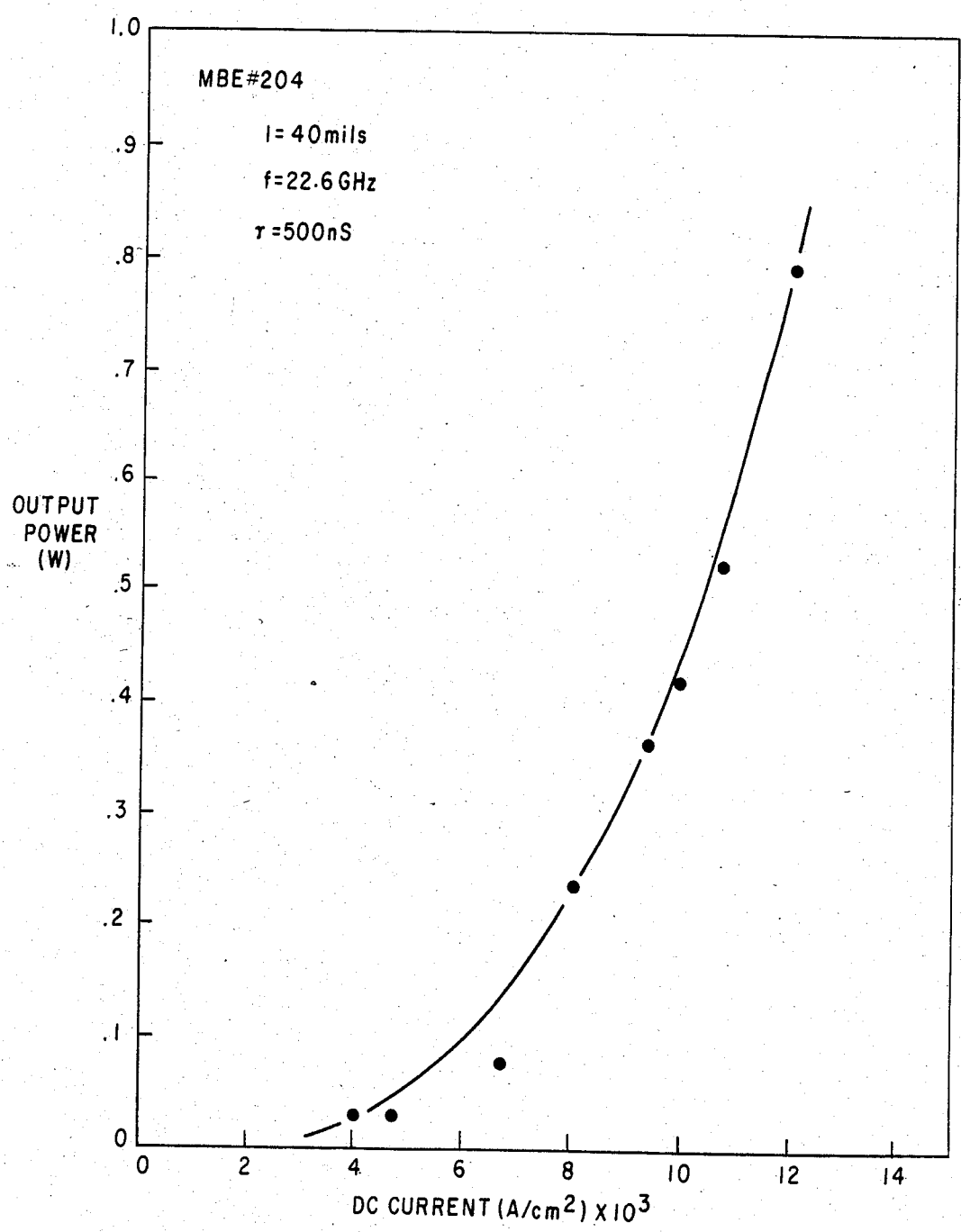
FIGS. 7 and 8 show sample relations of output power to dc bias current.
Figure 8:
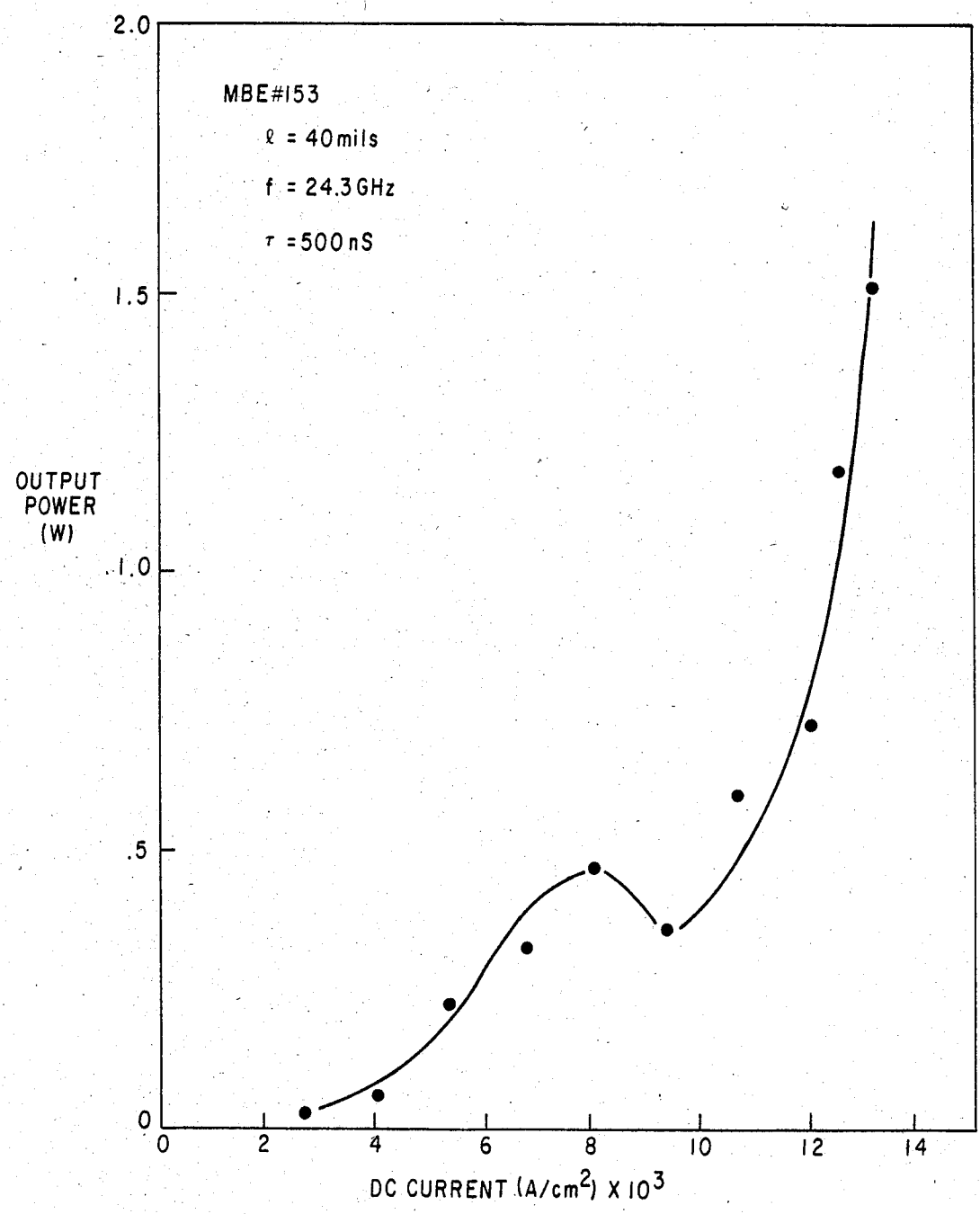
Figure 9:
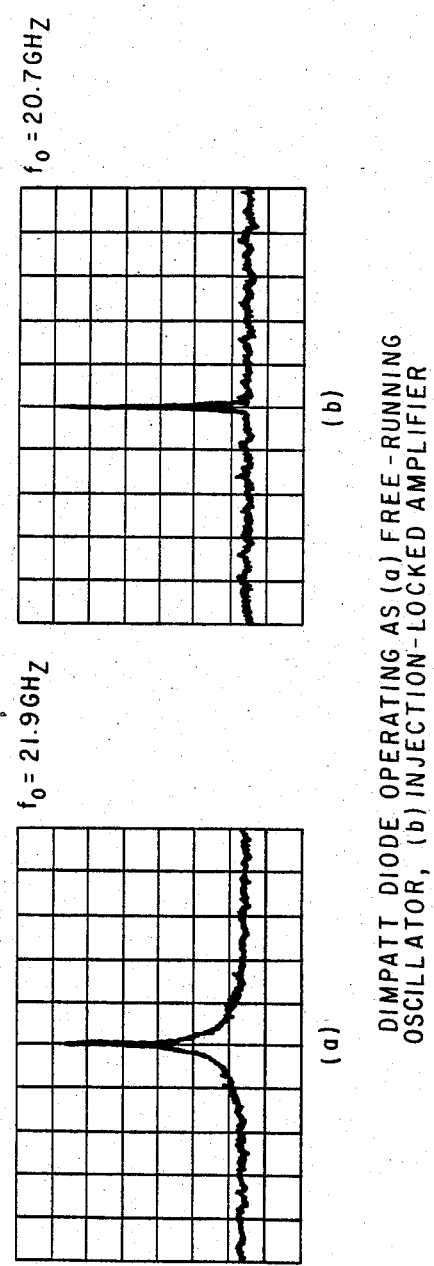
FIGS. 9a and 9b show the difference in Q between an IMPATT device according to the present invention operating as a free running oscillator (FIG. 9a), and an IMPATT device according to the present invention operating as an injection-locked amplifier (FIG. 9b)

When the diode is being operated as an oscillator, the fundamental resonant frequency of a diode is determined by its length, as shown in FIG. 6.

Figure 4:
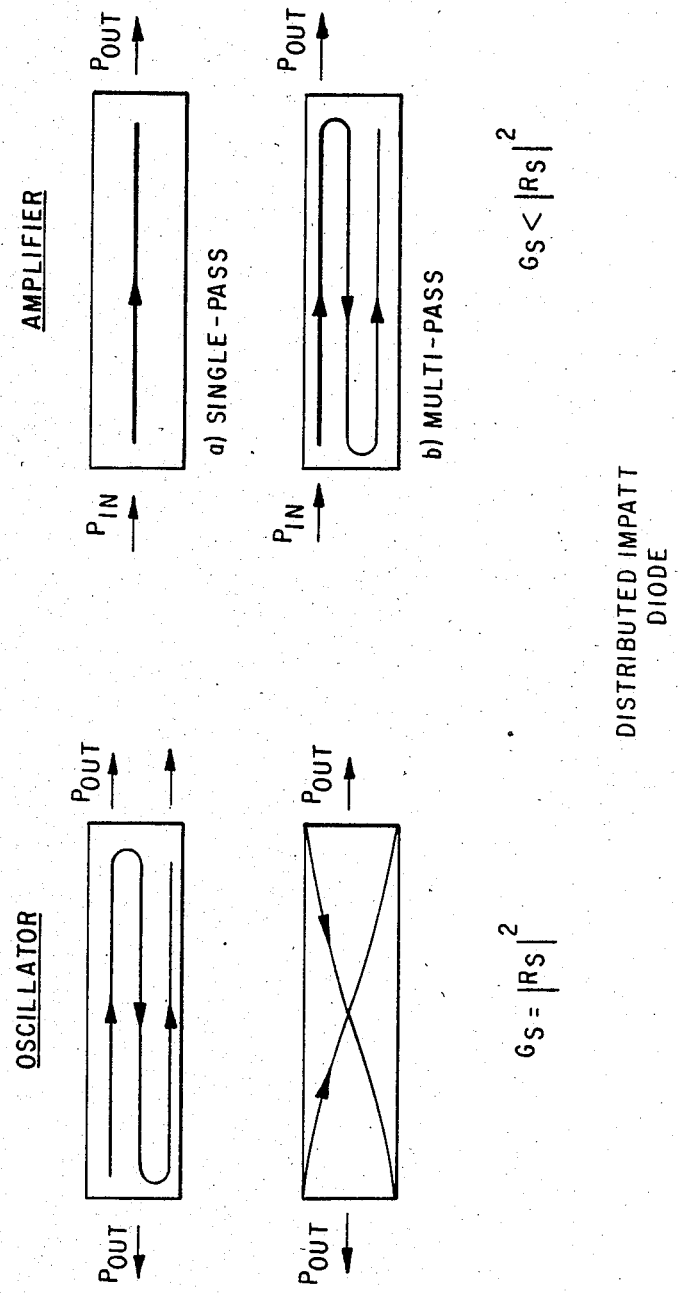
FIG. 4 shows how the relation between single pass gain and single-pass reflection coefficents determines whether a distributed device function as an oscillator, as a multi-pass 2-port amplifier, or effectively as a single-pass 2-port amplifier.

As seen in FIG. 4, the relation between single pass gain and the endpoint reflection coefficent determines whether a simple diode will act as an oscillator or an amplifier. If the single-pass voltage reflection coefficent squared is equal to the single-pass gain, the device will settle into a standing wave condition and will function as an oscillator. That is, if the single pass gain initially exceeds the reflection coefficent squared, the signal levels within the device rise until saturation begins to limit the gain, so that the equality condition is satisfied. On the other hand, if the reflection coefficient squared exceeds the single-pass gain, then the device will function as a multi-pass amplifier. If the reflection coefficient greatly exceeds the single-pass gain, then the amplification will effectively be single-pass amplification.

Figure 5:
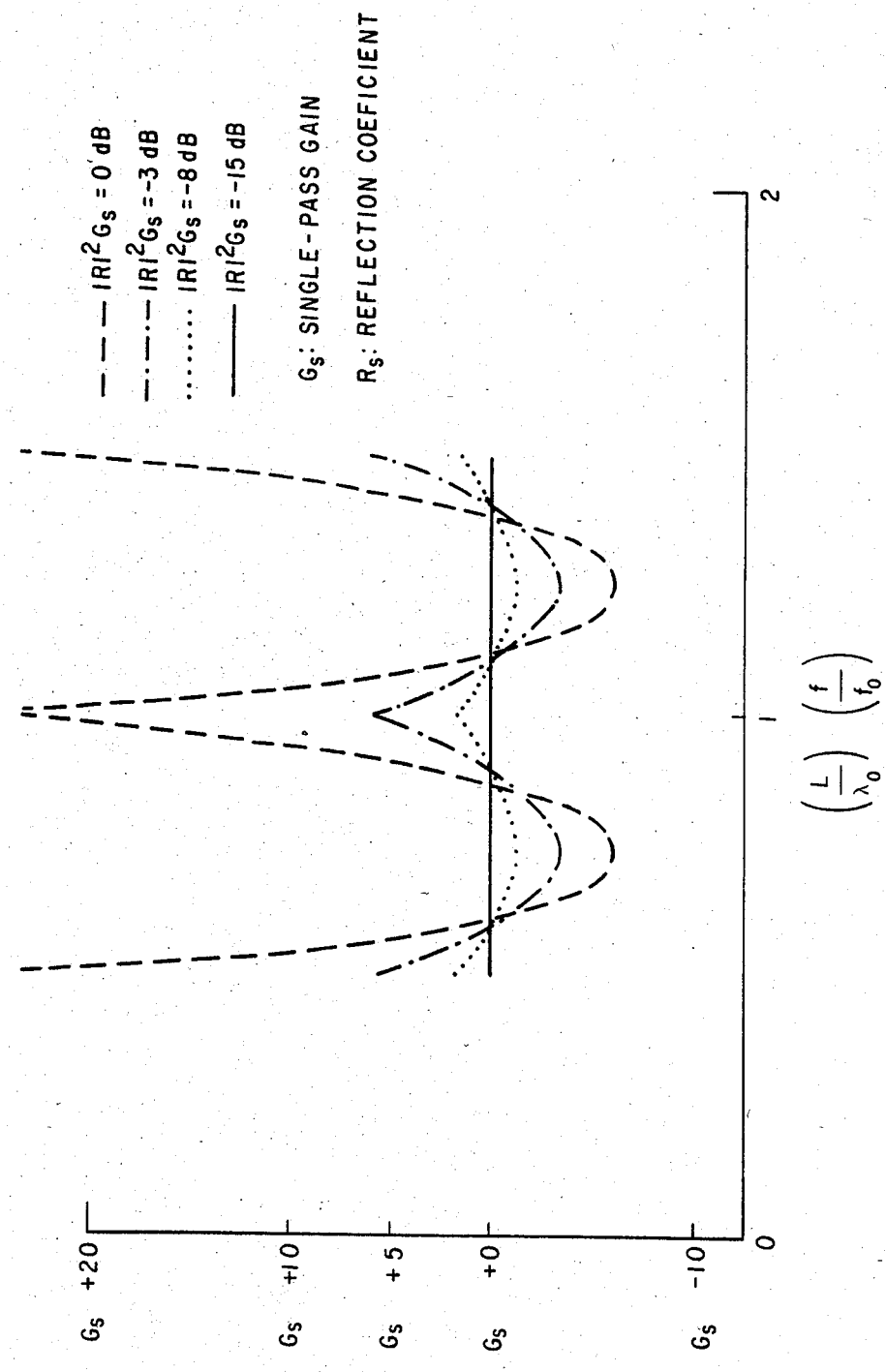
FIG. 5 shows curves showing frequency response characteristics of an oscillator, a single-pass amplifier embodiment, and two multi-pass amplifier embodiments, as related to the relation between single-pass gain and single-pass reflection coefficient.

These various operating modes imply different degrees of frequency selectivity. As shown in FIG. 5, an amplifier which is operating as single-pass will not be frequency selective, as shown by the solid curve. However, multi-pass amplification introduces increasing amounts of ripple, and the oscillator condition provides resonance.

FIG. 6 shows some sample implementations of the present invention, indicating the dependence of the fundamental mode of oscillating frequency on the device length. As noted, it is preferable to optimize the thickness of the drift regions (the lightly doped region between the heavily doped contact layers in an IMPATT device) for the operating frequency desired.

It is possible to get spatial harmonics in a cavity mode resonantor, but this tends not to be a major problem in distributed IMPATTS according to the present invention, because of the frequency-selectivity due to the thickness of the drift regions. Of course, in an extremely long device with appropriately shallow drift regions, the harmonics could be close enough together to have multiple stable oscillation frequencies. If it were desirable to configure a millimeter-wave comb filter, it could be done in this fashion.

In addition, the resonant frequency is somewhat sensitive to the thickness and doping of the contact layers 20 and 26. These contact layers load the transmission line, and therefore can lower the phase velocity of propagation in the transmission line and lowering the resonant frequency.

Figure 16:
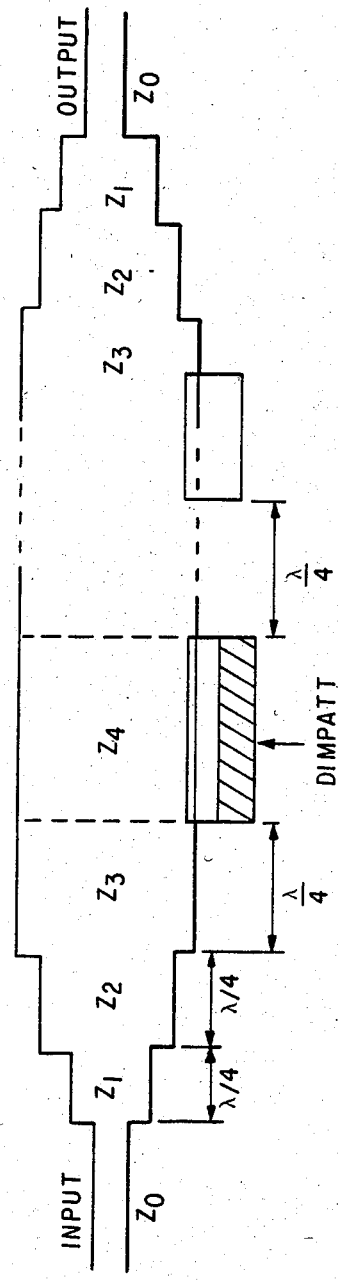
FIG. 16 shows impedance-matching transitions used to couple a microstrip having imput impedance ZO to a distributed IMPATT diode according to the present invention having a lower impedance.

Depending on the DIMPATT characteristic impedance, the side coupling microstrip characteristic impedance may need to be small. In this case, it is desirable to transition from standard 50SL transmission line at the input to low impedance 23 in several lambda/4 transformers. (lambda corresponds to the wavelength in the microstrip at the center frequency of the frequency band). Multi-section transformers give broader band impedance matching. A similar x/4 transformer section increases characteristic impedance level at the output terminal. FIG. 16 shows this conjunction; preferably the impedances increase geometrically.

Figure 17:
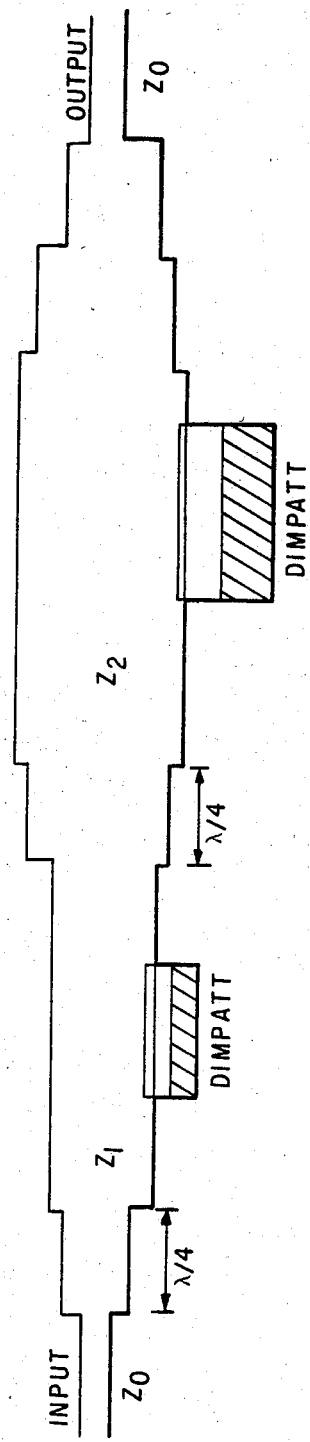
FIG. 17 shows a power-combining circuit, including microstrip impedance-matching transformations between two distributed IMPATTs according to the present invention having different respective widths.

For specific applications it may be desirable to change DIMPATT width; in other words, use wider devices closer to the output end, to ensure that each device experiences similar power densities. In this case it may be desirable to couple devices closer to input port at a different impedance level than those closer to output, as shown in FIG. 17.

Figure 18:
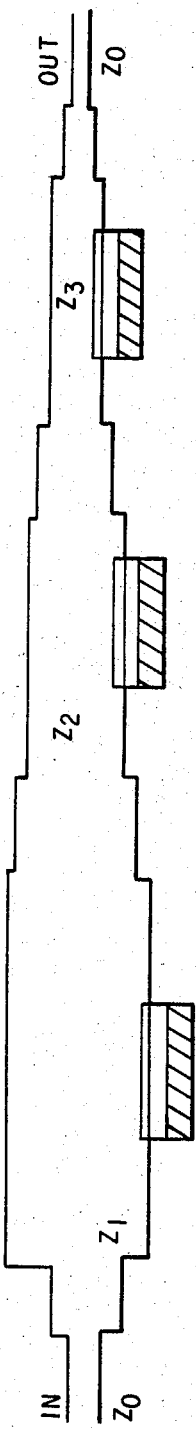
FIG. 18 shows a different power-combining scheme, wherein plural distributed IMPATTs according to the present invention are more weakly coupled to the microstrip regions wherein the power is higher.

Alternatively similar size diodes can be used, but with the coupling changed towards the output. This can be achieved, as shown in FIG. 18, by again changing the characteristic impedance of the microstrip. Near the input port, better impedance match is supplied so that the device is strongly coupled. The second device is less strongly coupled and the last device is weakly coupled.

In this fashion, as the wave moves towards the output port, less of it propagates through the active medium of the DIMPATT. Although a lesser portion is going through the last device, the absolute value of power density in each device can be same since the wave propagating in the microstrip is gaining in power.

The two approaches are somewhat similar. The difference is that the de-coupling is achieved in one by changing line impedance, and in the other, by changing device impedance.

Alternatively, where it is desired to ensure oscillatory behavior, this can again be accomplished by patterning of the side coupler 14 to assure an impedance discontinuity at the end of the active region 16.

Another way of ensuring single pass amplification activity is to use a magnetic field with a ferrite substrate, to ensure directionality. That is, as is well known in the art, if the substrate 10 is made of a ferrimagnetic material, and a dc bias magnetic field is applied normal to the plane of the substrate, wave propogation will preferentially occur in one direction, so that the device of the present invention will simply act as a single-pass 2 port amplifier.

To combine multiple oscillators or amplifiers according to the present invention, they can simply be connected in series along a transmission line. That is, the sidewall coupler 14 can be extended to provide a microstrip transmission line, with a plurality of active regions 16 spaced along it.

As the active region 16 is made wider, the power handling capacity naturally increases. However, if the active region 16 is made too wide, the characteristic impedance of the device becomes small and effective impedance matching at input/output ports becomes more difficult.

A practical upper limit for device length is about one tenth of one wavelength of the electromagnetic wave propagating in the device. For a given area device, length/width ratio should be kept as large as possible to reduce thermal impedance without exceeding specific limits imposed on the device length. Devices operating as oscillators need to be of specific lengths whereas those operating as amplifiers, phase shifters or attenuators can be of varying length depending on application needs. The gain of an amplifier, phase shift of a phase shifter and the attenuation of an attenuator is a strong function of device length (also, to function to suppress unwanted oscillations, the device length should be chosen such that the IMPATT action cannot supply adequate gain at the frequency which would be suitable for oscillators dictated by device length).

Figure 19:
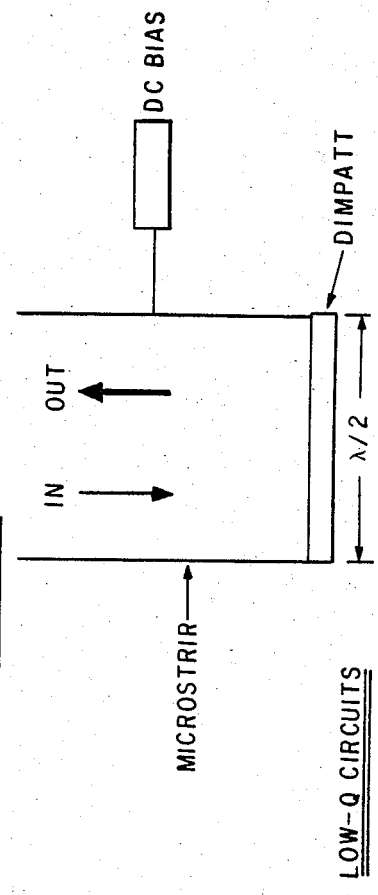
FIG. 19 shows a further embodiment of the present invention, wherein the side contact is still uninterrupted along the length of the active diode region, but is extended as a wide microstrip line in a direction normal to the propagation direction of the distributed IMPATT.
Figure 20:
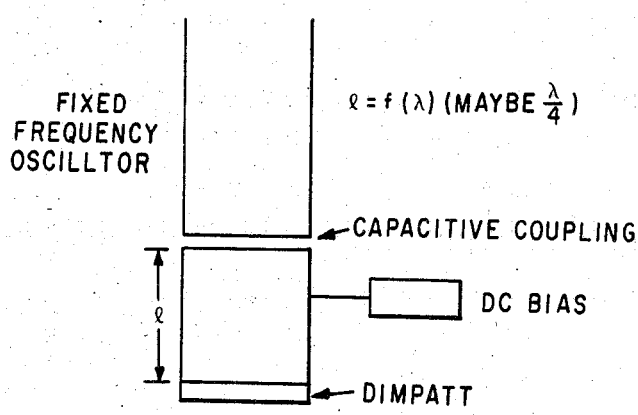
FIG. 20 shows a further way of coupling energy from an oscillator according to the present invention, wherein the coupling is again performed through a wide microstrip extending normal to the long direction of the IMPATT diode.

Thus, the key teaching of the present invention is that power is coupled out of a distributed negative resistance diode using a side contact which is coupled to the diode along substantially all of the length of the diode active region. This teaching, which has fundamental novelty, can be modified and varied to provide a wide range of embodiments. While the most preferred embodiments couple the distributed IMPATT to a microstrip line having a propagation direction parallel to the long direction of the diode, as shown in FIG. 3, embodiments such as FIGS. 19 and 20 couple the IMPATT to a wide microstrip line extending normal to the long dimension of the diode.

Figure 21:
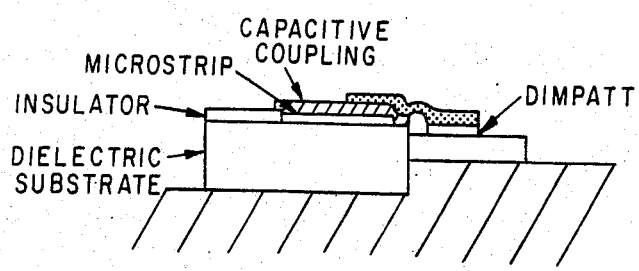
FIG. 21 shows a further embodiment of the present invention, wherein the sidewall contact is capacitatively coupled, but not d.c. coupled, to an extended microstrip line running parallel to the IMPATT diode region.

The side contact of the distributed diode of the present invention can be d.c. coupled as a microstrip transition line, but it is alternatively possible to capacitatively couple the sidewall contact to a microstrip transmission line, as shown in FIG. 21. Under strong coupling conditions, the Q of the distributed IMPATT is lowered, and the distributed IMPATT device can therefore be injection locked over a wide frequency range. Additional devices can be coupled with the same microstripe line. In order to achieve nonreciprocity, in addition to the methods noted above, isolators may be inserted between the distributed IMPATT devices.

Thus the present invention provides a fundamental innovation in the art of microwave devices, having as advantages all of the above enumerated objects of the invention. While the present invention has been described with reference to one particular embodiment, it teaches a general concept of very broad applicability. The present invention is therefore not limited except as specified in the accompanying claims, which are to be construed broadly.

Figure 22:
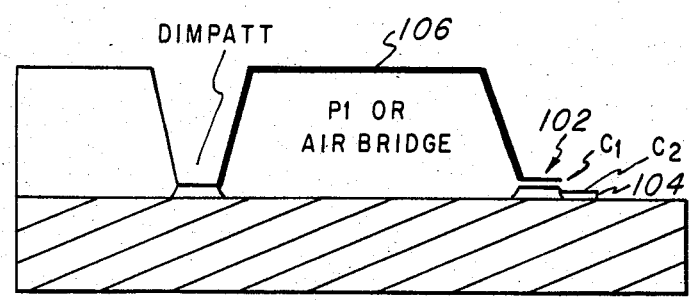
FIG. 22 shows a cross section of the distributed voltage-controlled oscillator of the present invention.
Figure 23:
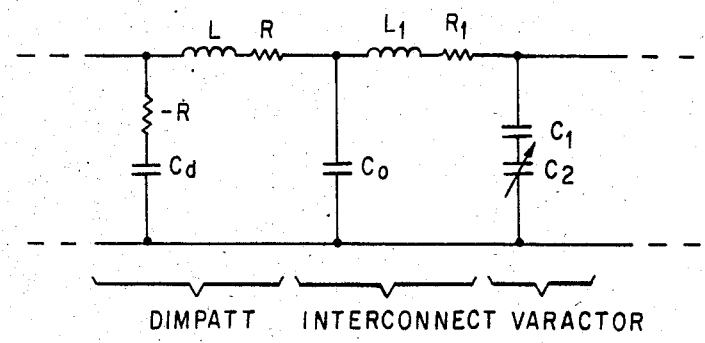
FIG. 23 shows a schematic circuit diagram of the differential circuit elements corresponding to a transmission line model of the distributed voltage controlled oscillator of the present invention.
Figure 24:
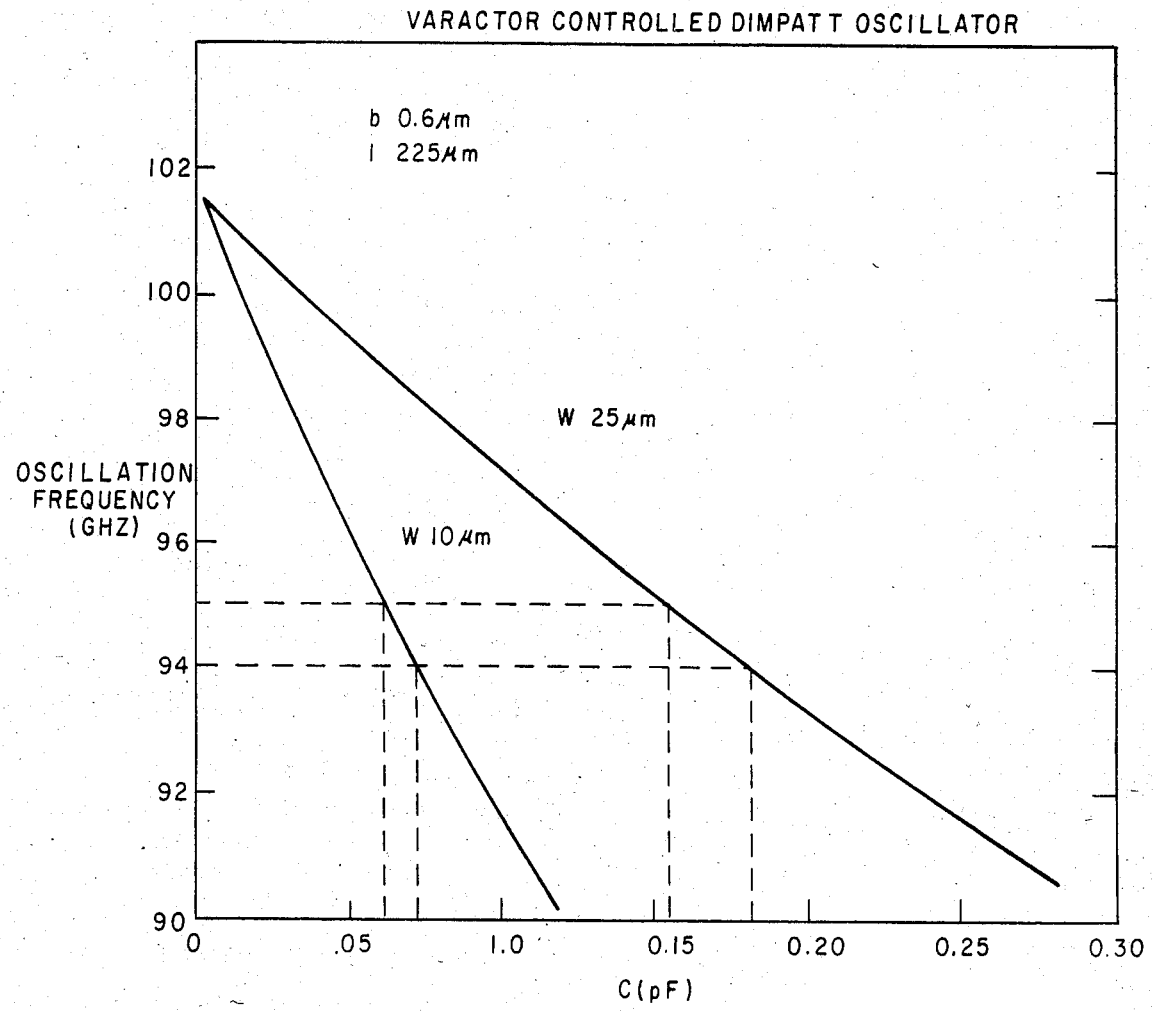
FIG. 24 shows oscillation frequency obtained for capacitances as shown.

This distributed oscillator structure is adapted to form a distributed VCO, simply by including a variable capacitance element in the transmission line. That is, as seen in FIG. 22, the sidewall contact of the distributed IMPATT (or other distributed oscillator) is also attached as one terminal of a (preferably distributed) variable capacitance. This variable capacitance 102 has a back bias contact 104, and, by varying the bias on the distributed capacitor of 102, the loading on the transmission line can be changed. This means that the phase velocity on a transmission line is changed, and this in turn means that the oscillation frequency of a fixed-length cavity will also change. However, the cavity will still be resonanting in its fundamental mode, and will still therefore provide a highly stable high-Q oscillator. Moreover, once the distributed capacitance has been changed, the oscillator will acquire a new resonant frequency in only a few cavity transit times. This means that such an oscillator has extreme frequency stability.

In the presently preferred embodiment, this is configured with a distributed IMPATT structure as described above. An air bridge 106 connects the sidewall contact of a distributed IMPATT structure to a distributed varactor structure 102. The distributed varactor structure preferably has a specific capacitance of approximately one tenth of the specific capacitance of the distributed IMPATT oscillator.

In the presently preferred embodiment, the distributed IMPATT structure is a double drift IMPATT having an active region which is a total of 0.6 microns thick at a doping of about $2 \mathrm{E} 10_17$ per cubic centimeter, as described above. The air bridge is made of Au which is approximately 3 microns thick. The distributed capacitor is laterally separated from the active distributed IMPATT structure by approximatey 15 microns. The distributed capacitance itself preferably comprises a backside contact layer of GaAs, deposited directly on a substrate, which is about 2 mils thick and doped to at least 5E18 per cubic centimeter. Atop this provided at least one additional layer of GaAs, which is more lightly doped with the opposite contactivity type. A heavily doped top contact region permits ohmic contact to the air bridge 108.

Thus, it is preferable that the distributed varactor structure be formed simply using the same semiconductor layer structure as is used to form the active region of the distributed IMPATT. This provides the ease in fabrication. The bias voltage applied at the varactor bias contact 110 is naturally much less (e.g. about 5 v) than that used to bias the IMPATT (e.g. about 15 v).

Alternatively, the variable capacitance could be formed simply by the depletion region under a Schottky-Barrier contact, or by other means well known to those skilled in the art.

It is not necessary that the distributed varactor elements have the same length as the distributed IMPATT elements, although this is preferable.

Figure 25:
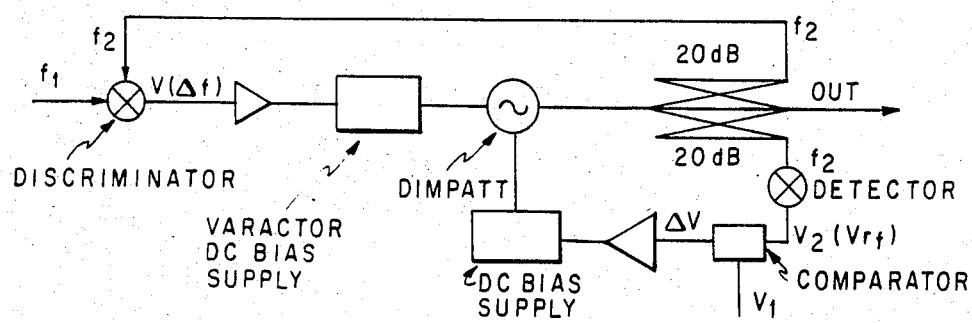
FIG. 25 shows a sample application at the present invention as a phase-locked oscillator.

A sample application example of the varactor controlled DIMPATT oscillator of the present invention is a phase-locked oscillator, which in essence is an amplifier with low noise figure, as shown in FIG. 25.

In this application, the frequency and the amplitude of the output power from the DIMPATT is sampled through weak coupling. In one branch, the output frequency and the input signal are compared at a discriminator where output voltage is proportional to the frequency difference delta-$f = f_2 - f_1$. This video signal is amplified and used to control the d.c. bias of the varactor diode until the DIMPATT frequency is locked onto $f_1$. A second sampling of the output power can be fed to a detector whose output voltage is proportional to rf voltage. This voltage is amplified and used to control d.c. bias current which controls output power. Output power can be thus levelled to a desired value.

As will be obvious to those skilled in the art, the present invention provides a fundamental new innovation in monolithic microwave integrated circuits, and in solid state microwave and millimeter-wave components generally. An extremely broad scope of the equivalents of the present invention is therefore asserted, and the scope of the present invention is expressly not limited except as set forth in the accompanying Claims.

What is claimed is:

1. A voltage-controlled oscillator comprising:
   (a) a semiconductor diode active region interposed between frontside and backside contacts, said semiconductor active region defining a negative resistance diode between said frontside and backside contacts;
   (b) said semiconductor active region and said frontside and backside contacts being elongated in a first direction;
   (c) said frontside contact being extended beyond said active region in a direction normal to said first direction to form a transmission line having a principal direction of propagation substantially parallel to said first direction; and
   (d) a separate variable-capacitance element coupled to said frontside contact for controlling the propagation characteristic of said transmission line.

2. The oscillator of claim 1, wherein said frontside contact is capacitatively coupled to a microstrip line, said microstrip line extending beyond said active region in a direction substantially parallel to said first direction.

3. The oscillator of claim 1, wherein said negative resistance diode is an IMPATT diode.

4. The oscillator of claim 3, wherein said IMPATT diode is a double-drift IMPATT diode.

5. The oscillator of claim 2, wherein said microstrip is impedance-matched to said diode.

6. The oscillator of claim 5, wherein said microstrip line is impedance-matched to a plurality of said active diode regions, each said active diode region being defined by a width dimension, each said width having a unique dimension.

* * * * *